US008536566B2

(12) United States Patent
Johansson et al.

(10) Patent No.: US 8,536,566 B2
(45) Date of Patent: Sep. 17, 2013

(54) SYSTEMS, METHODS AND APPARATUS FOR ACTIVE COMPENSATION OF QUANTUM PROCESSOR ELEMENTS

(75) Inventors: Jan Johansson, Burnaby (CA); Andrew J. Berkley, Burnaby (CA); Mohammad Amin, Burnaby (CA)

(73) Assignee: D-Wave Systems Inc., Burnaby (CA)

( * ) Notice: Subject to any disclaimer, the term of this patent is extended or adjusted under 35 U.S.C. 154(b) by 303 days.

(21) Appl. No.: 12/991,891

(22) PCT Filed: Sep. 3, 2009

(86) PCT No.: PCT/US2009/055939
§ 371 (c)(1),
(2), (4) Date: Nov. 9, 2010

(87) PCT Pub. No.: WO2010/028183
PCT Pub. Date: Mar. 11, 2010

(65) Prior Publication Data
US 2011/0057169 A1    Mar. 10, 2011

Related U.S. Application Data

(60) Provisional application No. 61/094,002, filed on Sep. 3, 2008.

(51) Int. Cl.
*H01L 39/22* (2006.01)
(52) U.S. Cl.
USPC ............................................................ 257/31
(58) Field of Classification Search
USPC .............. 257/31, E39.014; 326/4; 505/846
See application file for complete search history.

(56) References Cited

U.S. PATENT DOCUMENTS

| 6,984,846 | B2 | 1/2006 | Newns et al. .................. 257/31 |
| 7,533,068 | B2 | 5/2009 | Maassen van den Brink et al. .............................. 706/10 |

(Continued)

FOREIGN PATENT DOCUMENTS

| JP | 07-198816 | 8/1995 |
| JP | 09-033626 | 2/1997 |
| JP | 09-083027 | 3/1997 |
| WO | 2009/120638 | 10/2009 |
| WO | 2009/143166 | 11/2009 |

OTHER PUBLICATIONS

English Translation of Chinese Notification of the First Office Action, for corresponding Chinese Application No. 200980141676. X, mailed Jul. 16, 2012, 7 pages.

(Continued)

*Primary Examiner* — Marcos D. Pizarro
*Assistant Examiner* — Sue Tang
(74) *Attorney, Agent, or Firm* — Seed IP Law Group PLLC

(57) ABSTRACT

Apparatus and methods enable active compensation for unwanted discrepancies in the superconducting elements of quantum processor. A qubit may include a primary compound Josephson junction (CJJ) structure, which may include at least a first secondary CJJ structure to enable compensation for Josephson junction asymmetry in the primary CJJ structure. A qubit may include a series LC-circuit coupled in parallel with a first CJJ structure to provide a tunable capacitance. A qubit control system may include means for tuning inductance of a qubit loop, for instance a tunable coupler inductively coupled to the qubit loop and controlled by a programming interface, or a CJJ structure coupled in series with the qubit loop and controlled by a programming interface.

6 Claims, 6 Drawing Sheets

(56) References Cited

U.S. PATENT DOCUMENTS

| | | | |
|---|---|---|---|
| 2005/0250651 A1* | 11/2005 | Amin et al. | 505/846 |
| 2006/0147154 A1 | 7/2006 | Thom et al. | 385/37 |
| 2007/0180586 A1 | 8/2007 | Amin | |
| 2008/0176750 A1 | 7/2008 | Rose et al. | 505/170 |
| 2008/0215850 A1 | 9/2008 | Berkley et al. | 712/1 |
| 2008/0238531 A1 | 10/2008 | Harris | 327/528 |
| 2008/0274898 A1 | 11/2008 | Johnson et al. | 505/190 |
| 2009/0121215 A1 | 5/2009 | Choi | 257/31 |

OTHER PUBLICATIONS

Feldman, "The Josephson Junction as a Variable Inductance Tuner," Extended Abstracts of the Fourth International Superconductive Electronics Conference, pp. 32-33, Aug. 1993.

International Search Report, mailed May 6, 2010, for PCT/US2009/055939, 3 pages.

Written Opinion, mailed May 6, 2010, for PCT/US2009/055939, 3 pages.

* cited by examiner

SYSTEMS, METHODS AND APPARATUS FOR ACTIVE COMPENSATION OF QUANTUM PROCESSOR ELEMENTS

CROSS REFERENCE TO RELATED APPLICATIONS

This application is a U.S. national stage application filed under 35 U.S.C. 371 of International Patent Application PCT/US2009/055939, accorded an international filing date of Sep. 3, 2009 which claims benefit under 35 U.S.C. 119(e) of U.S. Provisional Patent Application Ser. No. 61/094,002, filed Sep. 3, 2008 and entitled "Systems, Methods and Apparatus for Active Compensation of Quantum Processor Elements," both of which are incorporated herein by reference in their entirety.

BACKGROUND

Field

The present systems, methods and apparatus generally relate to superconducting devices and particularly relate to active compensation of superconducting elements in a quantum processor.

Superconducting Qubits

There are many different hardware and software approaches under consideration for use in quantum computers. One hardware approach employs integrated circuits formed of superconducting material, such as aluminum and/or niobium, to define superconducting qubits. Superconducting qubits can be separated into several categories depending on the physical property used to encode information. For example, they may be separated into charge, flux and phase devices. Charge devices store and manipulate information in the charge states of the device; flux devices store and manipulate information in a variable related to the magnetic flux through some part of the device; and phase devices store and manipulate information in a variable related to the difference in superconducting phase between two regions of the phase device.

Many different forms of superconducting flux qubits have been implemented in the art, but all successful implementations generally include a superconducting loop (i.e., a "qubit loop") that is interrupted by at least one Josephson junction. Some embodiments implement multiple superconducting loops connected in series and/or in parallel with one another. Some embodiments implement multiple Josephson junctions connected either in series or in parallel with one another. In the art, a pair of Josephson junctions that are connected in parallel with one another is known as a compound Josephson junction ("CJJ"). It is understood that the behavior of a CJJ may be modeled as a single effective Josephson junction, similar to the way in which the behavior of multiple resistors connected in parallel with one another may be modeled as a single effective resistance.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in U.S. Pat. No. 7,533,068, US Patent Publication 2008-0176750, US Patent Publication 2009-0121215, and PCT Patent Application Serial No. PCT/US2009/037984.

BRIEF SUMMARY

A variety of systems, methods and apparatus that enable active compensation of quantum processor elements are described.

At least one embodiment may be summarized as a circuit including a primary compound Josephson junction structure comprising two parallel current paths that are each formed of a material that is superconducting below a critical temperature, wherein each of the two parallel current paths of the primary compound Josephson junction structure includes a respective Josephson junction structure; and wherein the Josephson junction structure in a first one of the two parallel current paths of the primary compound Josephson junction structure includes a first secondary compound Josephson junction structure comprising two parallel current paths that are each formed of a material that is superconducting below a critical temperature, and at least two Josephson junctions, each of which interrupts a respective one of the two parallel current paths of the first secondary compound Josephson junction structure. The circuit may include a programming interface that is configured to couple control signals to the primary compound Josephson junction structure and/or a programming interface that is configured to couple control signals to the first secondary compound Josephson junction structure. The Josephson junction structure in a second one of the two parallel current paths of the primary compound Josephson junction structure may include a single Josephson junction that interrupts the second one of the two parallel current paths of the primary compound Josephson junction structure. Alternatively, the Josephson junction structure in a second one of the two parallel current paths of the primary compound Josephson junction structure may include a second secondary compound Josephson junction structure comprising two parallel current paths that are each formed of a material that is superconducting below a critical temperature, and at least two Josephson junctions, each of which interrupts a respective one of the two parallel current paths of the second secondary compound Josephson junction structure. In such embodiments, a programming interface may be configured to couple control signals to the second secondary compound Josephson junction structure.

At least one embodiment may be summarized as a superconducting qubit including a qubit loop formed by a first current path that is superconductive at or below a critical temperature; and a primary compound Josephson junction structure that interrupts the qubit loop, the primary compound Josephson junction structure comprising two parallel current paths that are each formed of a material that is superconducting below a critical temperature, wherein each of the two parallel current paths of the primary compound Josephson junction structure includes a respective Josephson junction structure; and wherein the Josephson junction structure in a first one of the two parallel current paths of the primary compound Josephson junction structure includes a first secondary compound Josephson junction structure comprising two parallel current paths that are each formed of a material that is superconducting below a critical temperature, and at least two Josephson junctions, each of which interrupts a respective one of the two parallel current paths of the first secondary compound Josephson junction structure. The superconducting qubit may be a superconducting flux qubit. A programming interface may be configured to couple control signals to the qubit loop, and/or a programming interface may be configured to couple control signals to the primary compound Josephson junction structure, and/or a programming interface may be configured to couple control signals to the first secondary compound Josephson junction structure. The Josephson junction structure in a second one of the two parallel current paths of the primary compound Josephson junction structure may include a single Josephson junction that interrupts the second one of the two parallel current paths of the primary compound Josephson junction structure. Alternatively, the Josephson junction structure in a second one of the two parallel current paths of the primary compound Josephson junction structure may include a second secondary compound Josephson junction structure comprising two parallel current paths that are each formed of a material that is superconducting below a critical temperature, and at least two Josephson junctions, each of which interrupts a respective one of the two parallel current paths of the second secondary compound Josephson junction structure. A programming interface may be configured to couple control signals to the second secondary compound Josephson junction structure.

At least one embodiment may be summarized as a superconducting qubit including a qubit loop formed by a first superconducting current path; a first compound Josephson junction structure formed by a first pair of parallel superconducting current paths, wherein the first compound Josephson junction structure interrupts the qubit loop, and wherein each superconducting current path in the first pair of parallel superconducting current paths is interrupted by at least one Josephson junction; and a series LC-circuit coupled in parallel with the first compound Josephson junction structure through a superconducting current path, wherein the series LC-circuit realizes a tunable capacitance. The superconducting qubit may be a superconducting flux qubit. The series LC-circuit may include at least one capacitance and a second compound Josephson junction structure coupled in series with the at least one capacitance, the second compound Josephson junction structure formed by a second pair of parallel superconducting current paths, wherein each superconducting current path in the second pair of parallel superconducting current paths is interrupted by at least one Josephson junction. A programming interface may be configured to couple control signals to the second compound Josephson junction structure and thereby tune the capacitance of the LC-circuit.

At least one embodiment may be summarized as a qubit control system including a superconducting qubit comprising a qubit loop formed by a superconducting current path, wherein the qubit loop is interrupted by at least one Josephson junction structure; and a first tunable coupler that is configured to inductively couple to the qubit loop, wherein the inductance of the first tunable coupler is controlled by a programming interface that is configured to inductively couple control signals to the first tunable coupler, and wherein the first tunable coupler is not substantially coupled to any other qubit. The superconducting qubit may be a superconducting flux qubit. The qubit control system may further include at least one additional tunable coupler that is configured to inductively couple to the qubit loop, wherein the inductance of the at least one additional tunable coupler is controlled by a programming interface that is configured to inductively couple control signals to the at least one additional tunable coupler, and wherein the at least one additional tunable coupler is not substantially coupled to any other qubit.

At least one embodiment may be summarized as a qubit control system including a superconducting qubit comprising a qubit loop formed by a superconducting current path, wherein the qubit loop is interrupted by at least one Josephson junction structure; at least one L-tuner compound Josephson junction structure that interrupts the qubit loop; and a programming interface that is configured to inductively couple control signals to the L-tuner compound Josephson junction structure, thereby controlling the inductance of the qubit loop. The superconducting qubit may be a superconducting flux qubit.

At least one embodiment may be summarized as a quantum processor including a first qubit having a first characteristic associated with a parameter; a second qubit having a second characteristic associated with the parameter, wherein the first characteristic of the first qubit is different from the second characteristic of the second qubit; a coupling system selectively configurable to provide communicative coupling between the first qubit and the second qubit; and at least one device that is selectively operable to tune the parameter of the first qubit such that the first characteristic of the first qubit matches the second characteristic of the second qubit. In some embodiments, the parameter may be selected from the group consisting of inductance and capacitance.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

Figure 1:
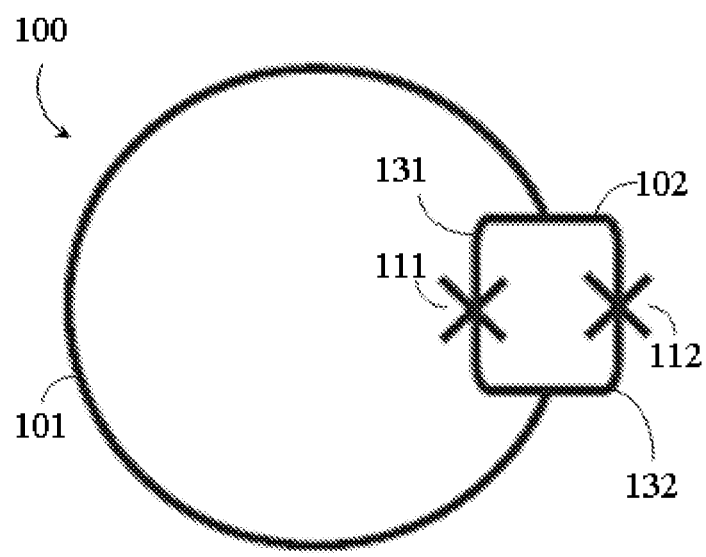
FIG. 1 is a schematic diagram of a conventional superconducting circuit that may be implemented as a superconducting flux qubit.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, coupling devices, and control systems including microprocessors and drive circuitry have not been shown or described in detail to avoid unnecessarily obscuring descriptions of the embodiments of the present systems, methods and apparatus. Throughout this specification and the appended claims, the words "element" and "elements" are used to encompass, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors. It should also be noted that the term "or" is generally employed in its sense including "and/or" unless the content clearly dictates otherwise.

The headings provided herein are for convenience only and do not interpret the scope or meaning of the embodiments.

The various embodiments described herein provide mechanisms that enable active compensation for unwanted discrepancies in the elements of a superconducting quantum processor. A superconducting quantum processor is a physical device that is fabricated by physical means (e.g., lithography, etching, depositing or depositioning, masking, chemical-mechanical planarization, etc.), and these fabrication processes may be imperfect. Unwanted discrepancies in the elements of a superconducting quantum processor can result, for example, from variations in any of these fabrication processes producing slight variations in the exact composition and construction of the various constituent devices (e.g., Josephson junctions, qubits, couplers, etc.). These discrepancies can influence the behavior of these devices and how they interact with one another. For example, if there is a discrepancy between the sizes of two Josephson junctions then there may be a discrepancy in the behavior and characteristic parameters of the two Josephson junctions. In some instances, for example in compound Josephson junctions ("CJJs"), it may be desirable to align the properties (e.g., critical currents) of two Josephson junctions to provide a particular behavior. A CJJ in which the behavior of two Josephson junctions differ due to a fabrication variation is said to exhibit "Josephson junction asymmetry." One aspect of the present systems, methods and apparatus provides a mechanism for actively compensating for Josephson junction asymmetry in the elements (e.g., qubits) of a superconducting quantum processor.

FIG. 1 is a schematic diagram of a conventional circuit 100 that may be implemented as a superconducting flux qubit. Circuit 100 comprises a first superconducting loop 101 that is interrupted by a second superconducting loop 102, which is itself interrupted by two Josephson junctions 111 and 112. Superconducting loop 101 is referred to hereinafter as the "qubit loop" while superconducting loop 102, together with the two Josephson junction 111 and 112, is referred to as the compound Josephson junction ("CJJ") structure. As illustrated in the Figure, CJJ structure 102 comprises a pair of parallel current paths 131, 132, each of which is interrupted by a respective Josephson junction 111, 112. In some applications, it may be desirable for the Josephson junctions 111, 112 within CJJ structure 102 to be substantially similar to one another, in order to facilitate control and manipulation of the qubit parameters. However, the physical process of fabricating Josephson junctions can result in Josephson junction asymmetries, such as an undesired discrepancy between, for example, the respective critical currents of Josephson junctions 111 and 112. In accordance with the present systems, methods and apparatus, active compensation of Josephson junction asymmetry may be achieved by replacing at least one Josephson junction (e.g., 111 or 112) within a CJJ structure (e.g., 102) with another CJJ structure. Throughout this specification and the appended claims, the term "CJJ structure" is used to denote a structure comprising at least two superconducting current paths that are connected electrically in parallel with one another, where each of the at least two superconducting current paths includes at least one respective Josephson junction structure; the term "Josephson junction structure" is used to denote an "effective" Josephson junction that may be realized by either a single physical Josephson junction or by multiple physical Josephson junctions electrically connected in series or in parallel with one another, similar in some respects to the way in which multiple resistors may be connected in series or in parallel with one another to realize a single "effective" resistance; and the term "primary CJJ structure" is used to denote a CJJ structure (e.g., CJJ 102) that directly interrupts a current path (e.g., a qubit loop 101) to provide an effective Josephson junction as a circuit element. In accordance with the present systems, methods and apparatus, a Josephson junction structure may be realized by either a single physical Josephson junction or by a physical CJJ structure. The term "secondary CJJ structure" is used herein to describe a CJJ structure that is nested within a primary CJJ structure to realize one of the Josephson junction structures in the primary CJJ structure.

Figure 2A:
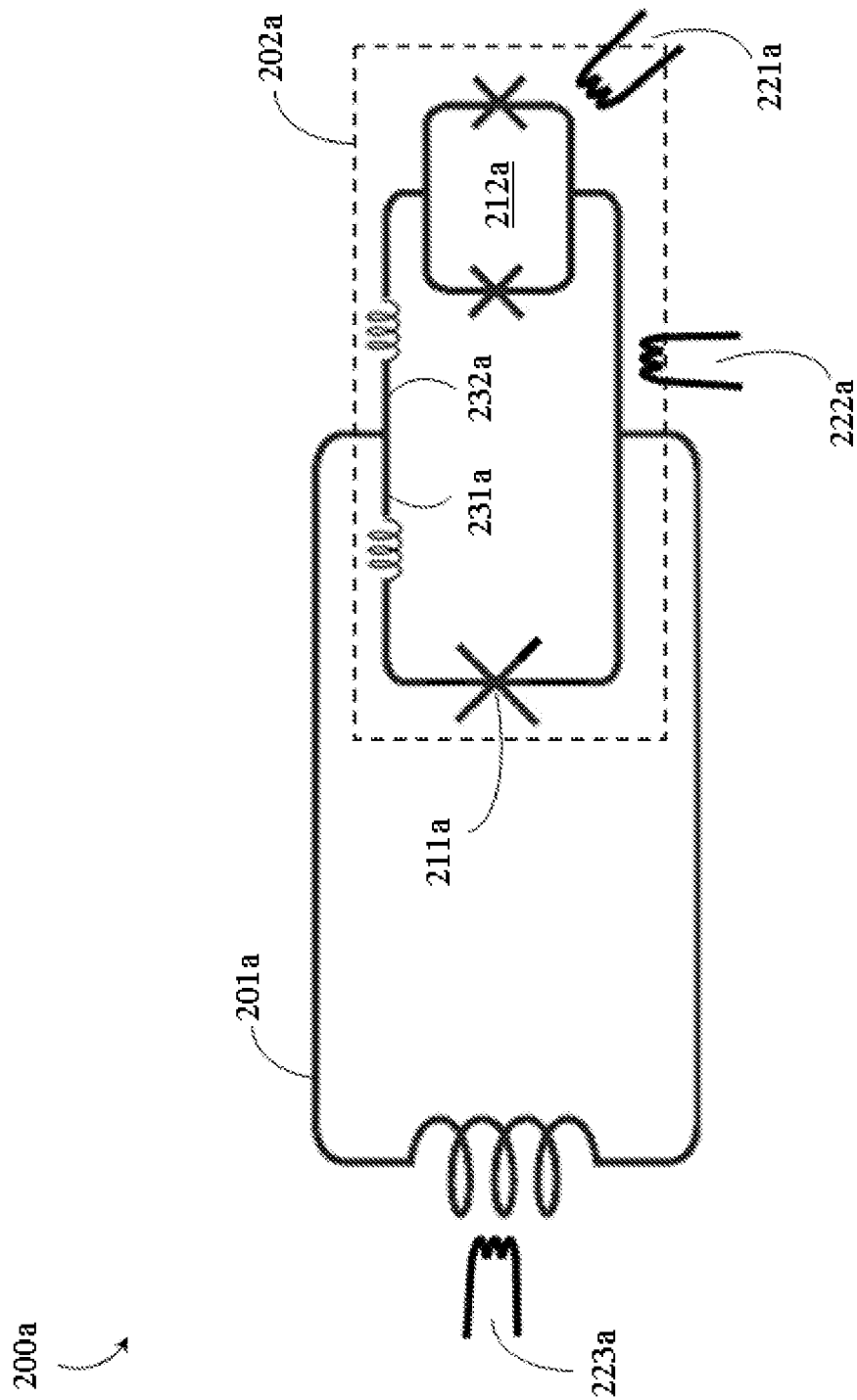
FIG. 2A is a schematic diagram of a superconducting qubit comprising a qubit loop interrupted by a primary compound Josephson junction structure in which one of the Josephson junctions is replaced with a secondary compound Josephson junction structure according to one illustrated embodiment.

FIG. 2A is a schematic diagram of an embodiment of a superconducting qubit 200a comprising a qubit loop 201a interrupted by a primary CJJ structure 202a comprising two Josephson junction structures 211a and 212a. Primary CJJ structure 202a comprises a pair of parallel current paths 231a, 232a, each of which is interrupted by a respective Josephson junction structure 211a, 212a. In accordance with the present systems, methods and apparatus, Josephson junction structure 212a is physically realized by a secondary CJJ structure 212a. Thus, Josephson junction 112 from circuit 100 is replaced by secondary CJJ structure 212a in qubit 200a. Similar to primary CJJ structure 202a, secondary structure CJJ 212a also comprises a pair of parallel current paths, each of which is interrupted by a respective Josephson junction (not labeled in the Figure to reduce clutter). Those of skill in the art will appreciate that a CJJ structure may be modeled as a single "effective Josephson junction" whose behavior is defined, at least in part, by the interactions between the at least two Josephson junctions that make up the CJJ structure and by programming a control signal that may be coupled into the CJJ loop. By coupling a control signal from a programming interface 221a into the secondary CJJ structure 212a, at least some characteristics of the secondary CJJ structure 212a may be tuned to match those of single Josephson junction 211a. Thus, while fabrication variations in circuit 100 from FIG. 1 may produce unwanted asymmetry between Josephson junctions 111 and 112, qubit 200a from FIG. 2A is adapted such that the primary CJJ structure 202a includes a secondary CJJ structure 212a in place of one of the single Josephson junctions (i.e., Josephson junction 112) to allow active matching of the two effective Josephson junctions (i.e., Josephson junction 211a and secondary CJJ structure 212a) in primary CJJ structure 202a. The tuning of secondary CJJ structure 212a is achieved by programming interface 221a, which may be configured to inductively couple control signals into secondary CJJ structure 212a. Furthermore, programming and manipulation of qubit 200a for the purposes of quantum computation may be achieved through programming interfaces 222a and 223a, which may be configured to inductively couple control signals to the primary CJJ structure 202a and the qubit loop 201a, respectively.

In some applications, it may be advantageous to enable additional control of the behavior of the at least two Josephson junction structures in the primary CJJ structure of a qubit.

Figure 2B:
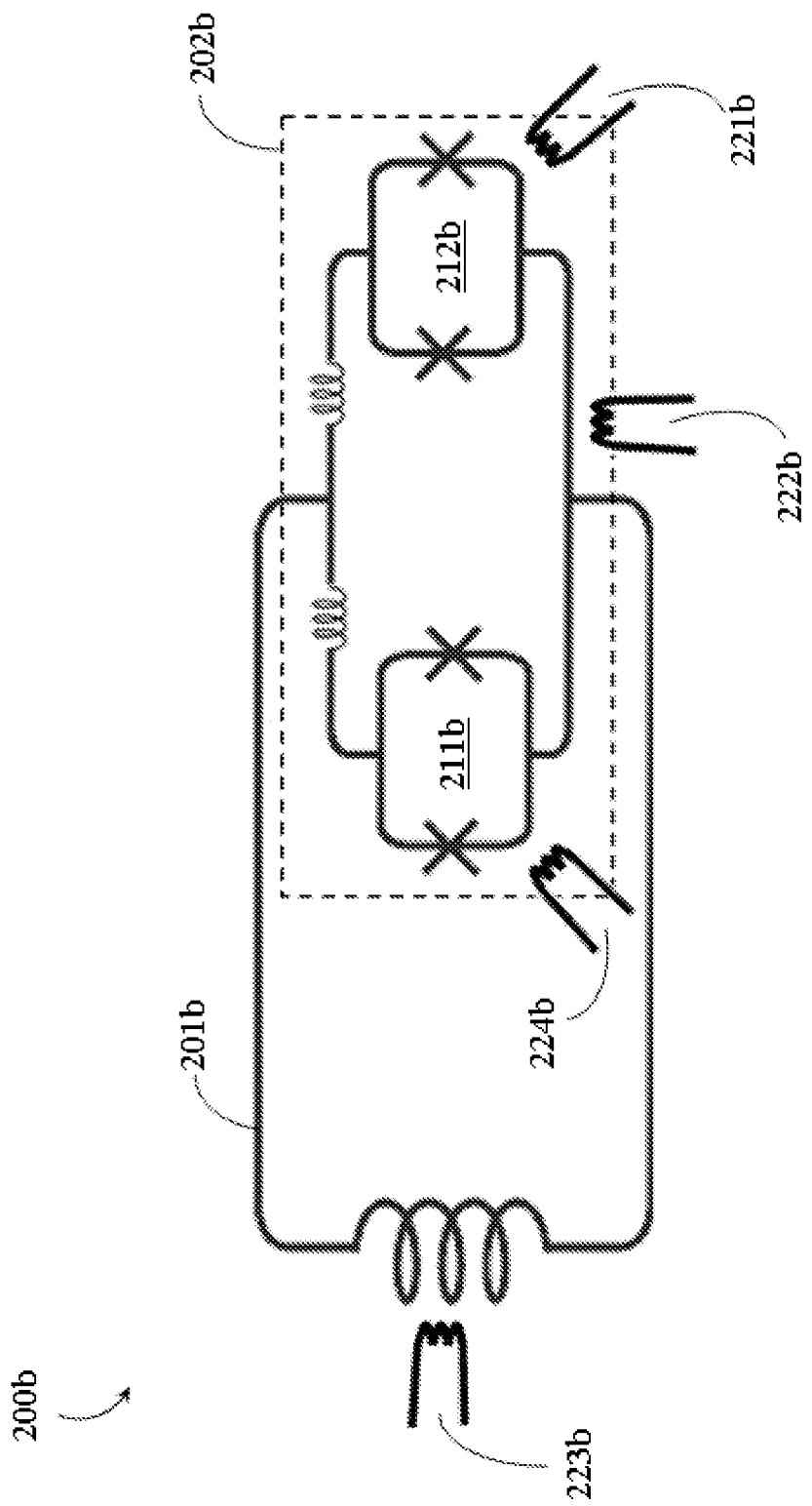
FIG. 2B is a schematic diagram of a superconducting qubit comprising a qubit loop interrupted by a primary compound Josephson junction structure in which both of the Josephson junctions are replaced with respective secondary compound Josephson junction structures according to one illustrated embodiment.

FIG. 2B is a schematic diagram of an embodiment of a superconducting qubit 200b comprising a qubit loop 201b interrupted by a primary CJJ structure 202b comprising a pair of parallel current paths, each of which is interrupted by a respective Josephson junction structures 211b and 212b. In qubit 200b, each of the Josephson junction structures is realized by a respective secondary CJJ structure 211b and 212b. Thus, single Josephson junction 211a from qubit 200a is replaced by another secondary CJJ structure 211b in qubit 200b. The primary CJJ structure 202b in qubit 200b is interrupted by two secondary CJJ structures 211b and 212b, each of which is tunable by a programming interface 224b and 221b, respectively. By tuning the characteristics of secondary CJJ structures 211b and 212b to substantially match one another, the negative effects of Josephson junction asymmetry in primary CJJ structure 202a may be mitigated. Programming and manipulation of qubit 200b for the purposes of quantum computation may be achieved through programming interfaces 222b and 223b, which may be configured to inductively couple control signals to the primary CJJ structure 202b and the qubit loop 201b, respectively.

Those of skill in the art will appreciate that the systems, methods and apparatus for actively compensating for Josephson junction asymmetry described herein and illustrated in the embodiments of FIGS. 2A and 2B may be used to reduce or create Josephson junction asymmetry either in advance of or during a quantum computation. In some embodiments, it may be advantageous to tune each secondary CJJ structure (e.g., 212a, 211b, and/or 212b) to eliminate asymmetry in each primary CJJ structure (e.g., 202a, 202b) before running a quantum computation. In some embodiments, a programming interface (such as any of programming interfaces 221a-223a, and 221b-224b) may include at least one digital-to-analog converter as described in US Patent Publication 2008-0215850 and PCT Application Serial No. PCT/US2009/044537.

It is typically desired that all of the qubits in a quantum processor behave substantially identically to one another. Thus, while the implementation of secondary CJJ structures within primary CJJ structures as described in FIGS. 2A and 2B may be used to overcome the effects of Josephson junction asymmetry within any given qubit, it is also important to note that this approach can enable tuning (i.e., synchronization) of the behavior of all of the qubits in a multi-qubit quantum processor. For example, in a quantum processor comprising a plurality of qubits 200b from FIG. 2B, programming interfaces 221b and 224b (for each respective qubit) may be used to compensate for asymmetry between the two Josephson junction structures 211b and 212b within each qubit 200b, and programming interfaces 221b, 222b, and 224b (again, for each respective qubit) may together be used to synchronize the behavior of all of the qubits in the processor.

Those of skill in the art will appreciate that the use of at least one secondary CJJ structure acting as an effective Josephson junction within a primary CJJ structure for the purpose of compensating for Josephson junction asymmetry may be incorporated into any application of CJJ structures and is not limited to use in superconducting qubits or quantum computation in general.

In addition to Josephson junction asymmetry, the total qubit capacitance is another parameter that is susceptible to unwanted discrepancies due to fabrication variations. The single qubit tunnel splitting $\Delta_i$ realized in each particular qubit is typically sensitive to the qubit capacitance, which can vary from one qubit to the next due to fabrication variations. Accordingly, a further aspect of the present systems, methods and apparatus provides a mechanism for actively compensating for discrepancies in the qubit capacitance of each qubit (or a subset of qubits) in a quantum processor by implementing a tunable capacitance. In an embodiment, this is achieved at the qubit level by coupling a series LC circuit in parallel with the CJJ structure (e.g., the primary CJJ structure) of the qubit, where the L (i.e., the inductance) is itself embodied by a tunable CJJ structure.

Figure 3:
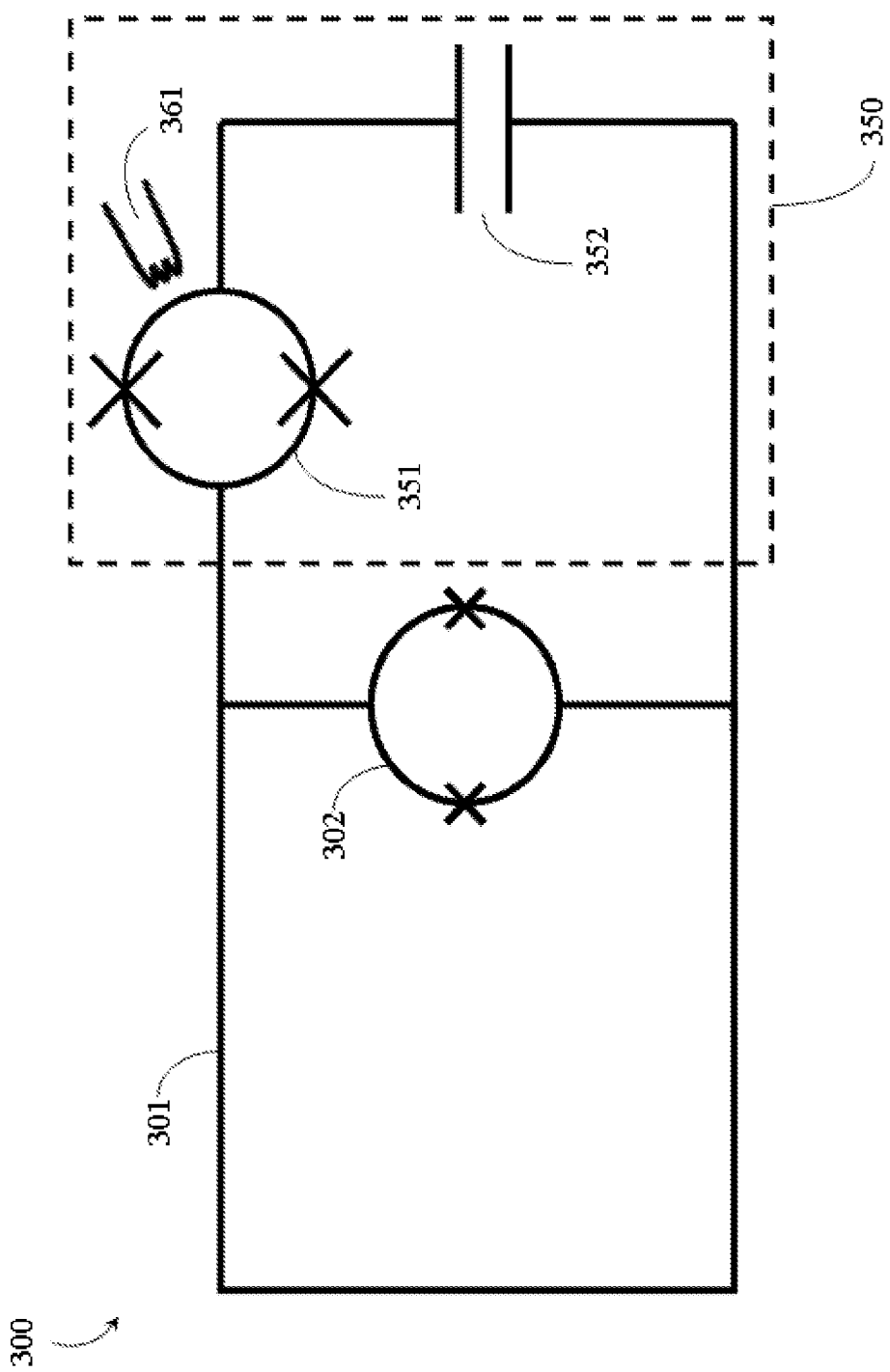
FIG. 3 is a schematic diagram of a superconducting flux qubit that is adapted to enable tunability of the qubit capacitance according to one illustrated embodiment.

FIG. 3 is a schematic diagram of an embodiment of a superconducting flux qubit 300 that is adapted to enable tunability of the qubit capacitance. Qubit 300 comprises a qubit loop 301 and a first CJJ structure 302, and in that regard qubit 300 is similar to circuit 100 from FIG. 1. However, in order to enable tunability of the qubit capacitance in qubit 300, a series LC circuit (encompassed by broken line box 350) is coupled in parallel with the first CJJ structure 302. In LC circuit 350, the inductance L is realized by a second CJJ structure 351 and the magnitude of this inductance L may be tuned using programming interface 361. Programming interface 361 may be configured to inductively couple control signals to second CJJ structure 351 and programming interface 361 may or may not include a digital-to-analog converter. Thus, the inductance of second CJJ structure 351 may be adjusted to tune the effective impedance at the plasma frequency of the qubit, which may influence the single qubit tunnel splitting $\Delta_i$. As the resonance frequency is moved from above the qubit plasma frequency to below, the effective loading impedance seen by CJJ structure 302 may move from capacitive to inductive. That is, while operating at a resonance frequency that is above the qubit plasma frequency, LC circuit 350 may contribute a capacitive impedance to qubit 300 due to capacitance 352. Using programming interface 361, the effective inductance of CJJ structure 351 may be increased to the point where the resonance frequency becomes less than the qubit plasma frequency, at which point LC circuit 350 may contribute an inductive impedance to qubit 300. Thus, in a certain parameter range the effective capacitance of the LC circuit 350, and therefore of the qubit 300, may be actively tuned to compensate for fabrication variations and produce the desired single qubit tunnel splitting $\Delta_i$. While capacitance 352 is illustrated as a discrete capacitor in FIG. 3, in some embodiments the capacitance 352 may take the form of a parasitic or inherent capacitance.

Those of skill in the art will appreciate that the systems, methods and apparatus for tuning qubit capacitance described herein and illustrated in the embodiment of FIG. 3 may be used to change the tunneling rate in a qubit either in advance of or during a quantum computation. In some embodiments, it may be desirable to tune each qubit capacitance in a quantum processor before running a quantum computation to provide a substantially uniform response to the evolving disorder term(s) applied to each qubit.

Qubit inductance is another parameter which may undesirably vary from qubit to qubit as a result of fabrication variations. Furthermore, the inductance of each qubit may depend, at least in part, on the programmed configuration of the quantum processor, and these inductances can change as the configuration of the quantum processor is reprogrammed. Accordingly, a further aspect of the present systems, methods and apparatus provides a mechanism for actively compensating for discrepancies in the qubit inductance of each qubit (or a subset of qubits) in a quantum processor. In one embodiment, this may be achieved by introducing at least one dedicated tunable coupler that couples to the qubit (e.g., to the qubit loop) and which may be tuned to compensate for any changes and/or discrepancies in the qubit inductance. In another embodiment, this may be achieved by introducing at least one CJJ structure (referred to hereinafter as an "L-tuner CJJ structure") in the qubit loop, where the Josephson inductance of the at least one L-tuner CJJ structure can be tuned to compensate for any changes and/or discrepancies in the qubit inductance. The ability of a Josephson device to tune inductance is described in M. J. Feldman, "The Josephson Junction as a Variable Inductance Tuner", Extended Abstracts of the Fourth International Superconductive Electronics Conference, pp 32-33, August 1993.

Figure 4A:
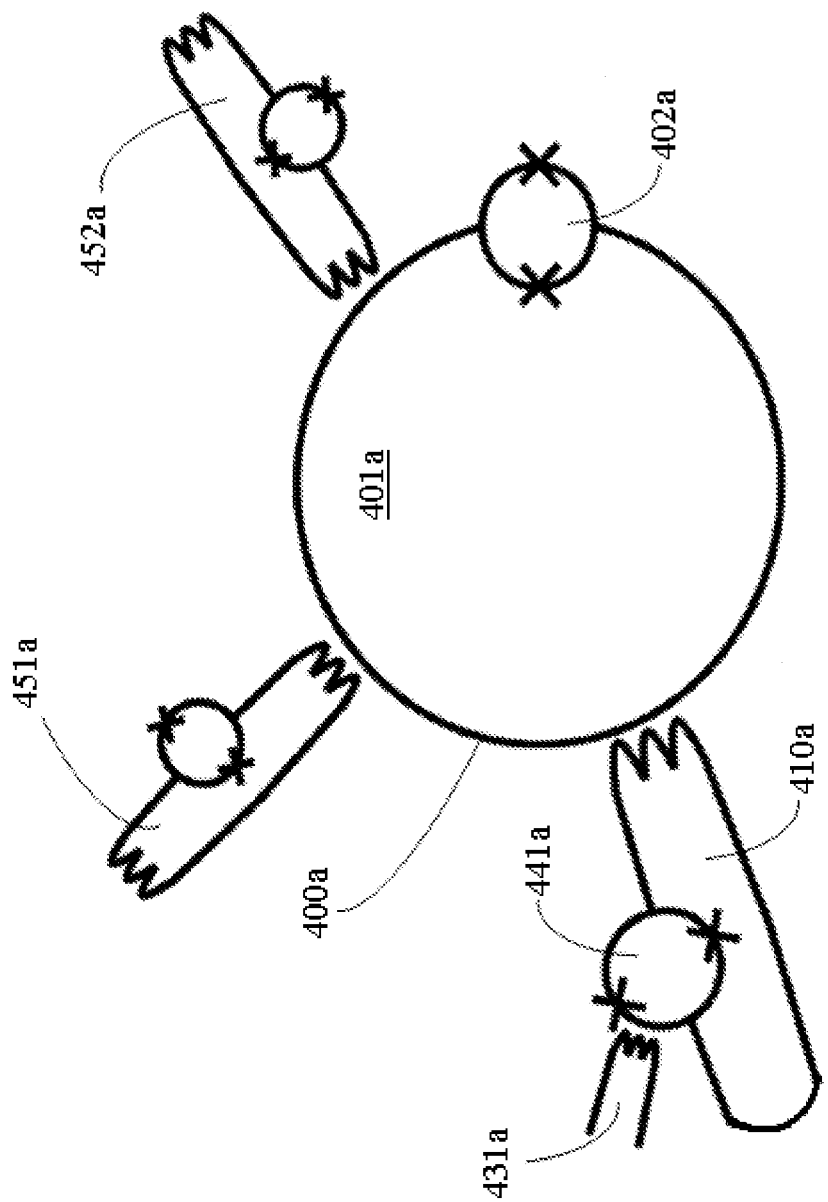
FIG. 4A is a schematic diagram of a superconducting flux qubit with a first dedicated tunable coupler for tuning the qubit inductance according to one illustrated embodiment.

FIG. 4A is a schematic diagram of an embodiment of a superconducting flux qubit 400a with a first dedicated tunable coupler 410a for tuning the qubit inductance. Coupler 410a may take the form of any superconducting qubit coupler, including but not limited to the couplers described in US Patent Publication 2006-0147154, US Patent Publication 2008-0238531, and US Patent Publication 2008-0274898. Qubit 400a comprises a qubit loop 401a that is interrupted by a CJJ structure 402a. Also shown in FIG. 4A are two exemplary inter-qubit couplers 451a and 452a, which may each be configured to communicably couple the qubit loop 401a of qubit 400a to a respective one of additional first and second other qubits (not shown). As presented in FIG. 4A, coupler 410a may be substantially similar in structure to the devices used as inter-qubit couplers 451a, 452a, except that coupler 410a is configured to communicably couple solely to qubit 400a and not substantially to any other qubit(s). That is, coupler 410a does not substantially communicatively connect qubit 400a to/from any other qubits, but rather serves as an adjustable extension of qubit 400a for tuning the effective inductance of qubit 400a. In alternative embodiments, the coupler structure that is employed for coupler 410a may differ from that employed for inter-qubit couplers 451a and 452a. The inductance of coupler 410a, and by extension the inductance of qubit 400a, is tunable by adjusting programming interface 431a. Thus, if a particular configuration of inter-qubit couplings (e.g., through inter-qubit couplers 451a and 452a) has an undesirable impact on the inductance of qubit 400a, then programming interface 431a may be used to tune coupler 410a and actively compensate for the undesired change in the qubit inductance, thereby setting the inductance of qubit 400a to the desired level. Similarly, if some fabrication variation(s) cause the inductance of qubit 401a to differ from the inductances of other qubits in the quantum processor, then tunable coupler 410a may be used to compensate for this discrepancy and adjust the inductance of qubit 401a to a desired level. In some embodiments, programming interface 431a may be configured to inductively couple to coupler 410a. In some embodiments, programming interface 431a may be configured to inductively couple to a CJJ structure 441a in coupler 410a. Those of skill in the art will appreciate that any number of coupling devices, such as coupler 410a, may similarly be coupled to qubit 400a for the purposes of tuning the qubit inductance.

Figure 4B:
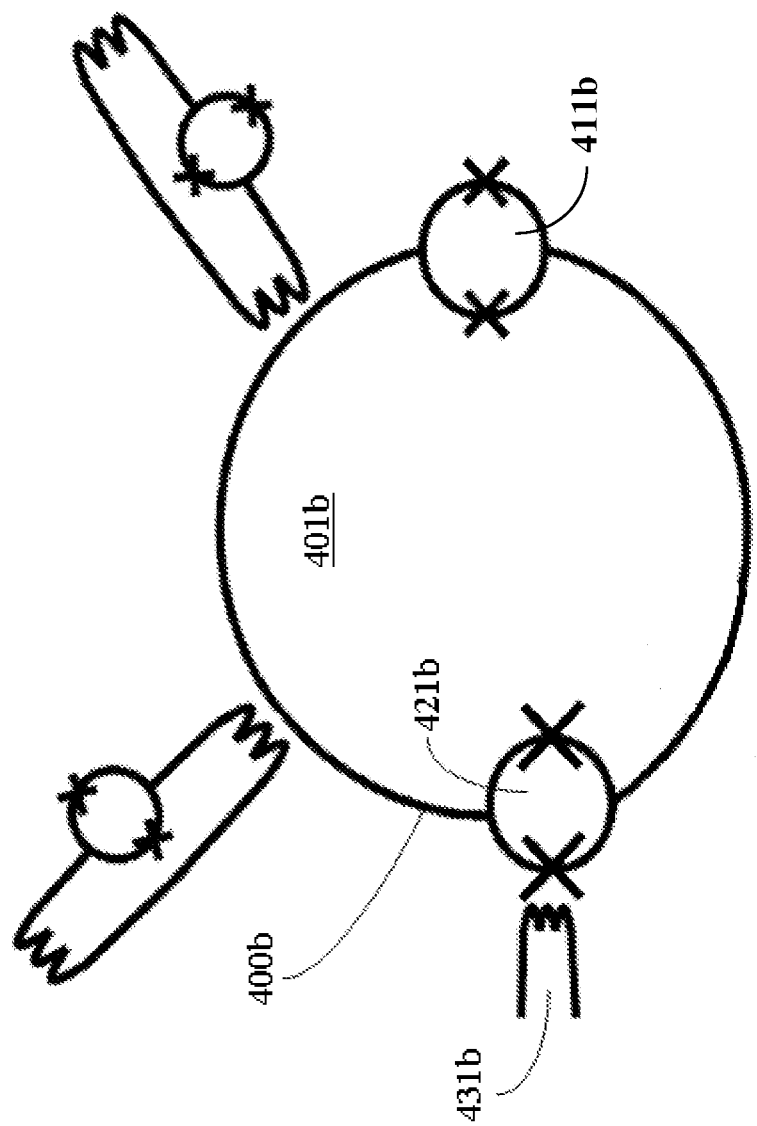
FIG. 4B is a schematic diagram of a superconducting flux qubit that includes an L-tuner CJJ structure connected in series in the qubit loop to enable tuning of the qubit inductance according to one illustrated embodiment.

Alternatively, FIG. 4B is a schematic diagram of an embodiment of a superconducting flux qubit 400b that includes a qubit CJJ structure 411b and an L-tuner CJJ structure 421b connected in series in the qubit loop 401b to enable tuning of the qubit inductance. In the embodiment shown in FIG. 4B, tuning of the qubit inductance is achieved in a substantially similar manner to that described for the embodiment shown in FIG. 4A, except that the qubit inductance is tuned directly within the qubit loop 401b as opposed to indirectly through inductive coupling to a tunable coupler (i.e., coupler 410a from FIG. 4A). The Josephson inductance of L-tuner CJJ structure 421b in the qubit loop 401b of qubit 400b may be tuned using programming interface 431b. In some embodiments, programming interface 431b may be configured to inductively couple control signals to L-tuner CJJ structure 421b. These control signals may be used to tune the Josephson inductance of L-tuner CJJ structure 421b, thereby tuning the inductance of qubit 400b. Those of skill in the art will appreciate that any number of L-tuner CJJ structures, may similarly be inserted in qubit loop 401b. In some embodiments (and as illustrated in FIG. 4B), the Josephson junctions in L-tuner CJJ structure 421b may preferably be larger than the Josephson junctions in the qubit CJJ structure 411b.

Those of skill in the art will appreciate that the systems, methods and apparatus for tuning qubit inductance described herein and illustrated in the embodiments of FIGS. 4A and 4B may be used to change the inductance of a qubit either in advance of or during a quantum computation. In some embodiments, it may be desirable to tune each qubit inductance in a quantum processor before running a quantum computation, after the inter-qubit coupler configuration has been programmed.

Those of skill in the art will appreciate that the various embodiments described herein providing various forms of active compensation of quantum processor elements may be combined in various ways into a single system. For example, a system may incorporate all or any combination of the mechanisms for tuning Josephson junction asymmetry, qubit capacitance, and qubit inductance. That is, a single qubit may include all or any combination of the mechanisms described in the present systems, methods and apparatus.

Those of skill in the art will appreciate that the present systems, methods and apparatus may be generally applied to any implementation of a quantum processor and are not limited to superconducting implementations. Due to inherent parametric discrepancies between real physical devices, most quantum computing systems while exhibit unwanted parametric discrepancies between qubits. In accordance with the various embodiments described herein, the negative effects of such discrepancies may be mitigated by implementing a quantum processor comprising: a first qubit having a first characteristic associated with a parameter; a second qubit having a second characteristic associated with the parameter, wherein the first characteristic of the first qubit is different from the second characteristic of the second qubit; a coupling system selectively configurable to provide communicative coupling between the first qubit and the second qubit; and at least one device that is selectively operable to tune the parameter of the first qubit such that the first characteristic of the first qubit matches the second characteristic of the second qubit.

According to the present state of the art, a superconducting material may generally only act as a superconductor if it is cooled below a critical temperature that is characteristic of the specific material in question. Throughout this specification and the appended claims, the term "superconducting" when used to describe a physical structure such as a "superconducting loop" is used to indicate a material that is capable of behaving as a superconductor at an appropriate temperature (i.e., below a critical temperature). A superconducting material may not necessarily be acting as a superconductor at all times in all embodiments of the present systems, methods and apparatus.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus of quantum computation, not necessarily the exemplary systems, methods and apparatus for quantum computation generally described above.

The various embodiments described above can be combined to provide further embodiments. All of the US patents, US patent application publications, US patent applications, foreign patents, foreign patent applications and non-patent publications referred to in this specification and/or listed in the Application Data Sheet, including but not limited to U.S. Provisional Patent Application Ser. No. 61/094,002, filed Sep. 3, 2008 and entitled "Systems, Methods and Apparatus for Active Compensation of Quantum Processor Elements"; U.S. Pat. No. 7,533,068; US Patent Publication 2008-0176750; US Patent Publication 2009-0121215; PCT Patent Application Serial No. PCT/US2009/037984; US Patent Publication 2008-0215850; PCT Application Serial No. PCT/US2009/044537; US Patent Publication 2006-0147154; US Patent Publication 2008-0238531; and US Patent Publication 2008-0274898 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting qubit having a mechanism to actively compensate for Josephson junction asymmetry, the superconducting qubit comprising:
a qubit loop formed by a first current path that is superconductive below a critical temperature;
a first programming interface that couples a control signal to the qubit loop;
a primary compound Josephson junction structure that interrupts the qubit loop, the primary compound Josephson junction structure comprising two parallel current paths that are each formed of a material that is superconducting below a critical temperature, wherein each of the two parallel current paths of the primary compound Josephson junction structure includes a respective Josephson junction structure;
a second programming interface that couples a control signal to the primary compound Josephson junction structure; and
wherein the mechanism to actively compensate for Josephson junction asymmetry comprises:
the Josephson junction structure in a first one of the two parallel current paths of the primary compound Josephson junction structure includes a first secondary compound Josephson junction structure nested within the primary compound Josephson junction structure, the first secondary compound Josephson junction structure comprising two parallel current paths that are each formed of a material that is superconducting below a critical temperature, and at least two Josephson junctions, each of which interrupts a respective one of the two parallel current paths of the first secondary compound Josephson junction structure; and
a third programming interface that couples a control signal to the first secondary compound Josephson junction structure and thereby tunes a characteristic of the first secondary compound Josephson junction structure to match a characteristic of the Josephson junction structure in a second one of the two parallel current paths of the primary compound Josephson junction structure.

2. The superconducting qubit of claim 1 wherein the superconducting qubit is a superconducting flux qubit.

3. The superconducting qubit of claim 1 wherein the Josephson junction structure in the second one of the two parallel current paths of the primary compound Josephson junction structure includes a single Josephson junction that interrupts the second one of the two parallel current paths of the primary compound Josephson junction structure.

4. The superconducting qubit of claim 1 wherein the mechanism to actively compensate for Josephson junction asymmetry further comprises:
the Josephson junction structure in the second one of the two parallel current paths of the primary compound Josephson junction structure includes a second secondary compound Josephson junction structure nested within the primary compound Josephson junction structure, the second secondary compound Josephson junction structure comprising two parallel current paths that are each formed of a material that is superconducting below a critical temperature, and at least two Josephson junctions, each of which interrupts a respective one of the two parallel current paths of the second secondary compound Josephson junction structure; and
a fourth programming interface that couples a control signal to the second secondary compound Josephson junction structure and thereby tunes a characteristic of the second secondary compound Josephson junction structure to match a characteristic of the first secondary compound Josephson junction structure.

5. The superconducting qubit of claim 4 wherein the fourth programming interface that couples a control signal to the second secondary compound Josephson junction structure tunes a critical current of the second secondary compound Josephson junction structure to match a critical current of the first secondary compound Josephson junction structure.

6. The superconducting qubit of claim 1 wherein the third programming interface that couples a control signal to the first secondary compound Josephson junction structure tunes a critical current of the first secondary compound Josephson junction structure to match a critical current of the Josephson junction structure in the second one of the two parallel current paths of the primary compound Josephson junction structure.

* * * * *